United States Patent
Cheng et al.

(10) Patent No.: US 7,550,359 B1
(45) Date of Patent: Jun. 23, 2009

(54) METHODS INVOLVING SILICON-ON-INSULATOR TRENCH MEMORY WITH IMPLANTED PLATE

(75) Inventors: Kangguo Cheng, Guilderland, NY (US); Herbert L. Ho, New Windsor, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/116,626

(22) Filed: May 7, 2008

Related U.S. Application Data

(63) Continuation of application No. 12/031,093, filed on Feb. 14, 2008, now Pat. No. 7,384,842.

(51) Int. Cl.
*H01L 21/00* (2006.01)
(52) U.S. Cl. .................. 438/392; 438/243; 438/389
(58) Field of Classification Search ................ 438/392, 438/243, 389
See application file for complete search history.

(56) References Cited

U.S. PATENT DOCUMENTS

| | | | |
|---|---|---|---|
| 5,770,484 A * | 6/1998 | Kleinhenz | 438/155 |
| 6,297,088 B1 * | 10/2001 | King | 438/243 |
| 6,635,525 B1 * | 10/2003 | Mandelman et al. | 438/243 |
| 6,815,749 B1 * | 11/2004 | Mandelman et al. | 257/301 |
| 6,825,545 B2 | 11/2004 | Nasr | |
| 6,964,897 B2 * | 11/2005 | Bard et al. | 438/243 |
| 7,009,237 B2 * | 3/2006 | Adkisson et al. | 257/301 |
| 7,073,139 B2 * | 7/2006 | Bard et al. | 716/1 |
| 7,129,130 B2 * | 10/2006 | Adkisson et al. | 438/243 |
| 7,276,751 B2 * | 10/2007 | Ho et al. | 257/296 |
| 7,384,842 B1 * | 6/2008 | Cheng et al. | 438/243 |
| 7,388,244 B2 * | 6/2008 | Ho et al. | 257/301 |
| 7,439,149 B1 * | 10/2008 | Cheng et al. | 438/386 |
| 2004/0248363 A1 * | 12/2004 | Bard et al. | 438/243 |
| 2004/0250221 A1 * | 12/2004 | Bard et al. | 716/1 |
| 2006/0202249 A1 * | 9/2006 | Cheng et al. | 257/301 |
| 2007/0057302 A1 * | 3/2007 | Ho et al. | 257/301 |
| 2007/0063244 A1 * | 3/2007 | Ho et al. | 257/301 |
| 2007/0218625 A1 * | 9/2007 | Ho et al. | 438/243 |
| 2008/0064178 A1 * | 3/2008 | Ho et al. | 438/389 |

\* cited by examiner

*Primary Examiner*—Laura M Menz
(74) *Attorney, Agent, or Firm*—Cantor Colburn LLP; Rosa Suazo

(57) ABSTRACT

A method for fabricating silicon-on-insulator (SOI) trench memory includes forming a trench on a substrate, wherein a buried oxide layer is disposed on the substrate, a SOI layer is disposed on the buried oxide layer, and a hardmask layer is disposed on the SOI layer, implanting ions into the substrate and the SOI layer on a first opposing side of the trench and a second opposing side the trench to partially form a capacitor, depositing a node dielectric in the trench, filling the trench with a first polysilicon, removing a portion of the first polysilicon from the trench, removing an exposed portion of the node dielectric, filling the trench with a second polysilicon, masking to define an active region on the hardmask layer, forming shallow trench isolation (STI) such that the STI contacts a portion of the buried oxide layer, removing the hardmask layer, and forming a transistor.

1 Claim, 8 Drawing Sheets

METHODS INVOLVING SILICON-ON-INSULATOR TRENCH MEMORY WITH IMPLANTED PLATE

CROSS-REFERENCE TO RELATED APPLICATION

This application is a continuation of U.S. patent application Ser. No. 12/031,093, filed Feb. 14, 2008, the disclosure of which is incorporated by reference herein in its entirety.

BACKGROUND OF THE INVENTION

1. Field of the Invention

This invention relates generally to semiconductor device processing techniques and, more specifically, to methods involving forming silicon-on-insulator (SOI) trench memory.

2. Description of Background

Silicon-on-insulator trench memories use arrays of transistors and capacitor plates to form memory arrays. Previous methods of fabricating deep trench dynamic random access memories (DRAM) used arsenic silica glass (ASG) layers. Such methods are complicated and costly. An improved method for forming a deep trench memory device with a buried plate is desired.

SUMMARY OF THE INVENTION

The shortcomings of the prior art are overcome and additional advantages are achieved through an exemplary method for fabricating silicon-on-insulator (SOI) trench memory, the method including, forming a trench on a substrate, wherein a buried oxide layer is disposed on the substrate, a SOI layer is disposed on the buried oxide layer, and a hardmask layer is disposed on the SOI layer, implanting ions into the substrate and the SOI layer on a first opposing side of the trench and a second opposing side of the trench to partially form a capacitor, depositing a node dielectric in the trench, filling the trench with a first polysilicon, removing a portion of the first polysilicon from the trench, removing an exposed portion of the node dielectric, filling the trench with a second polysilicon, masking to define an active region on the hardmask layer, forming shallow trench isolation (STI) such that the STI contacts a portion of the buried oxide layer, removing the hardmask layer, and forming a transistor.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Previous methods for fabricating silicon-on-insulator (SOI) trench memory (deep trench DRAM) are complicated and costly. Deep trench DRAM often includes capacitor plates buried in a substrate and a transistor array that is proximate to the capacitor plates. Implanting dopants in a deep trench formed in the substrate forms the capacitor plates. Often, the implanting of dopants results in substrate regions around the transistor becoming doped. The doping of the regions around the transistor is undesirable. Thus, it is desirable for a method of fabricating a deep trench with capacitor plates for a memory device to be simple and to prevent the doping of undesired regions of the substrate.

Figure 1:
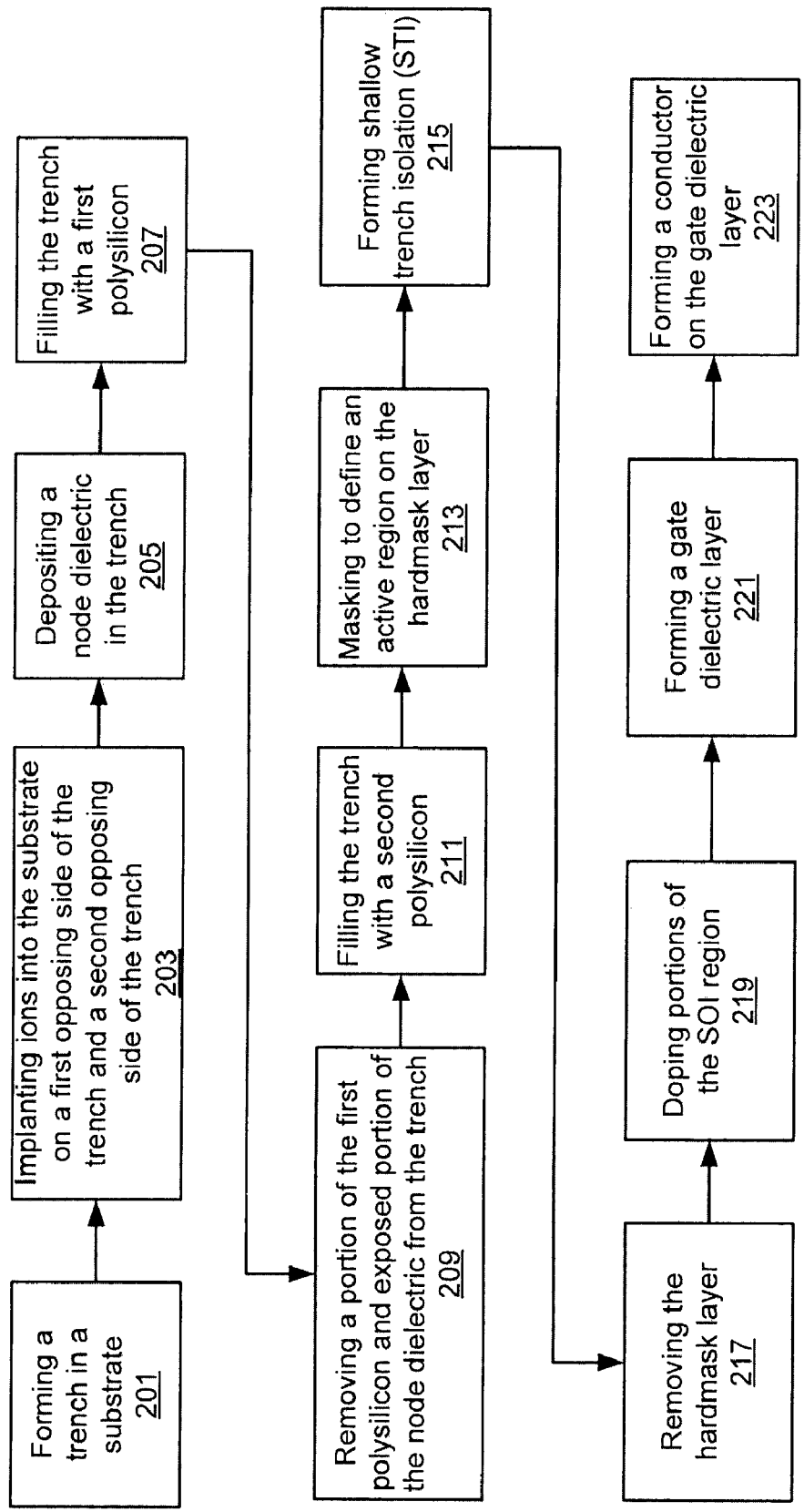
FIG. 1 illustrates a block diagram of an exemplary method for forming a deep trench memory device with a buried plate.
Figure 6:
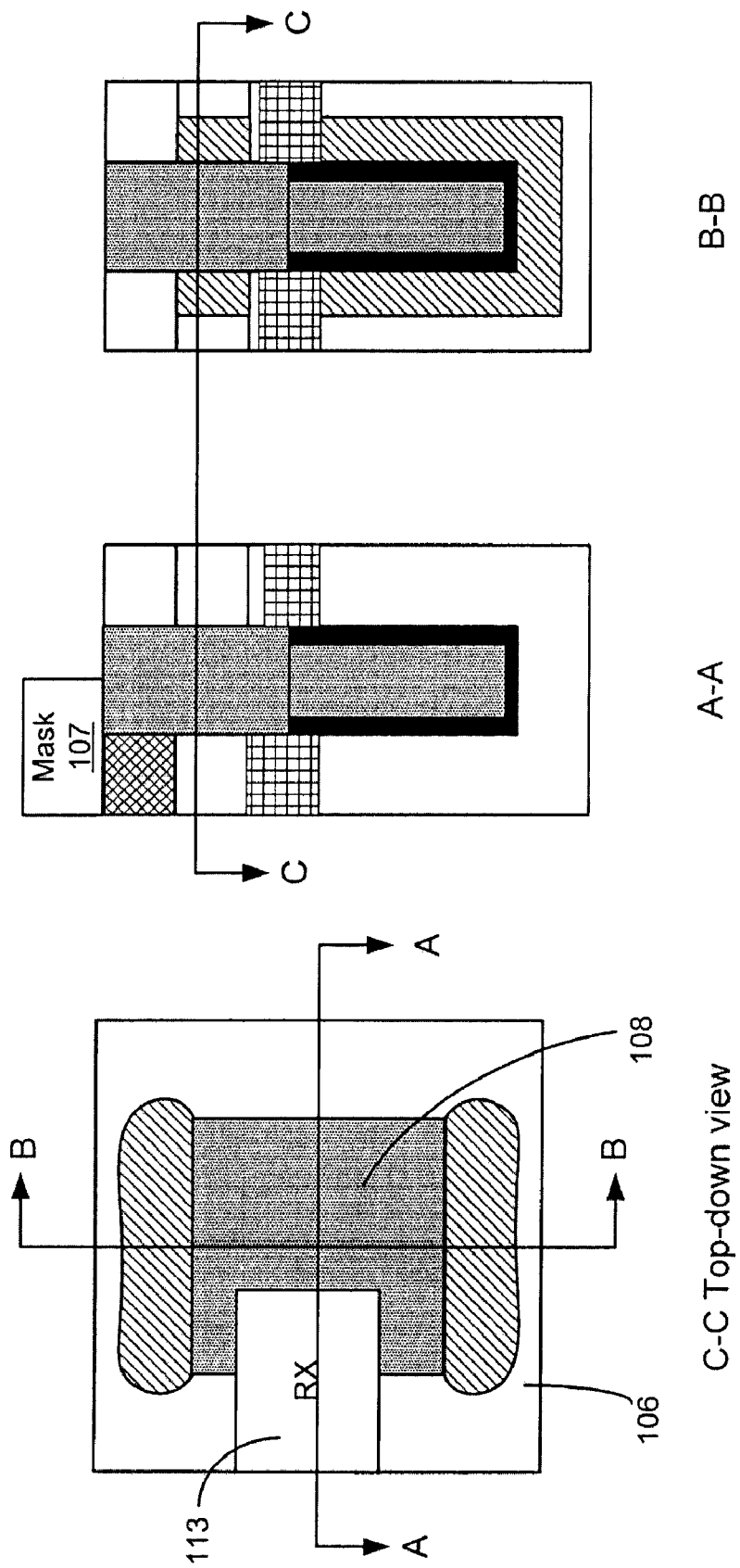
Figure 7:
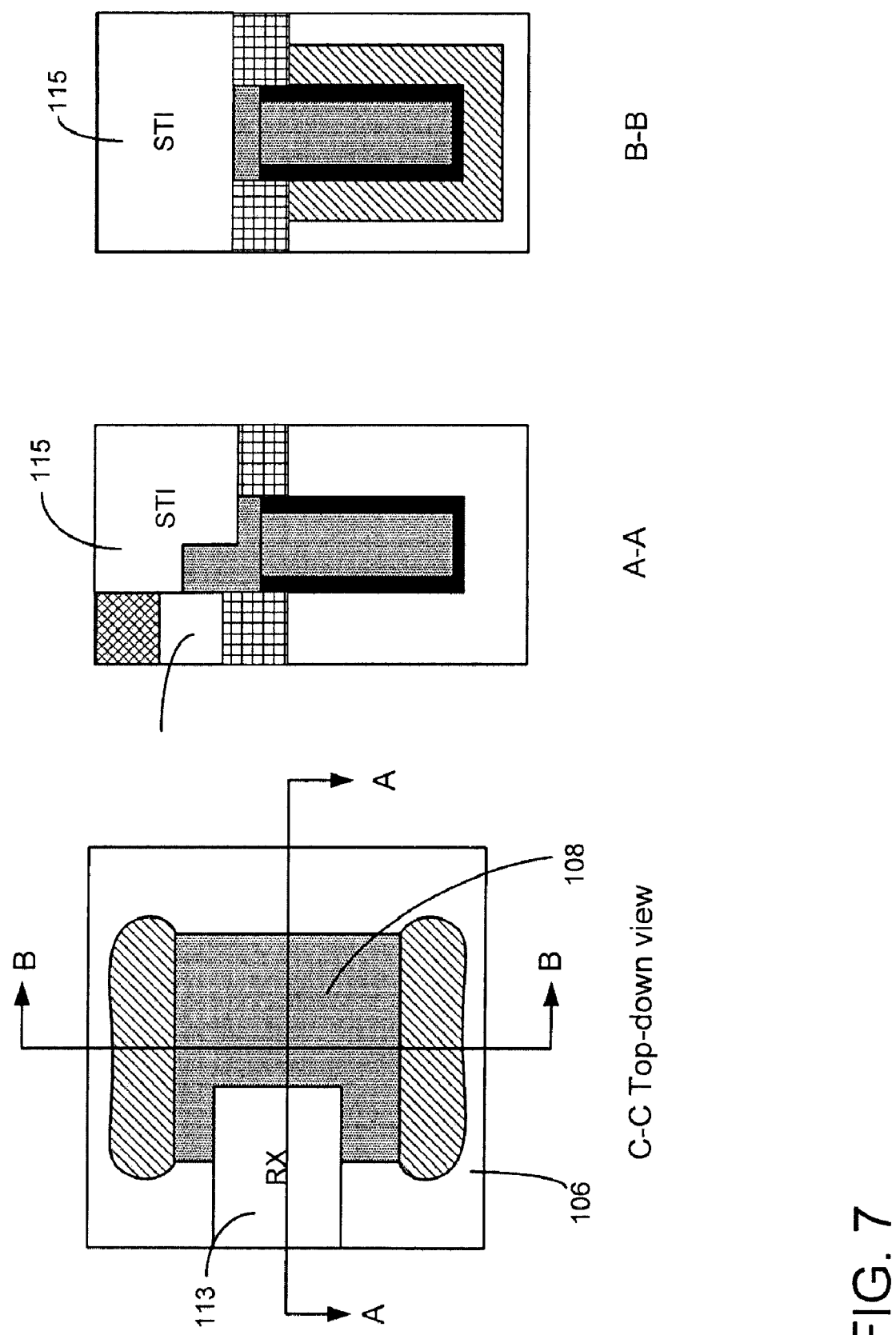
Figure 8:
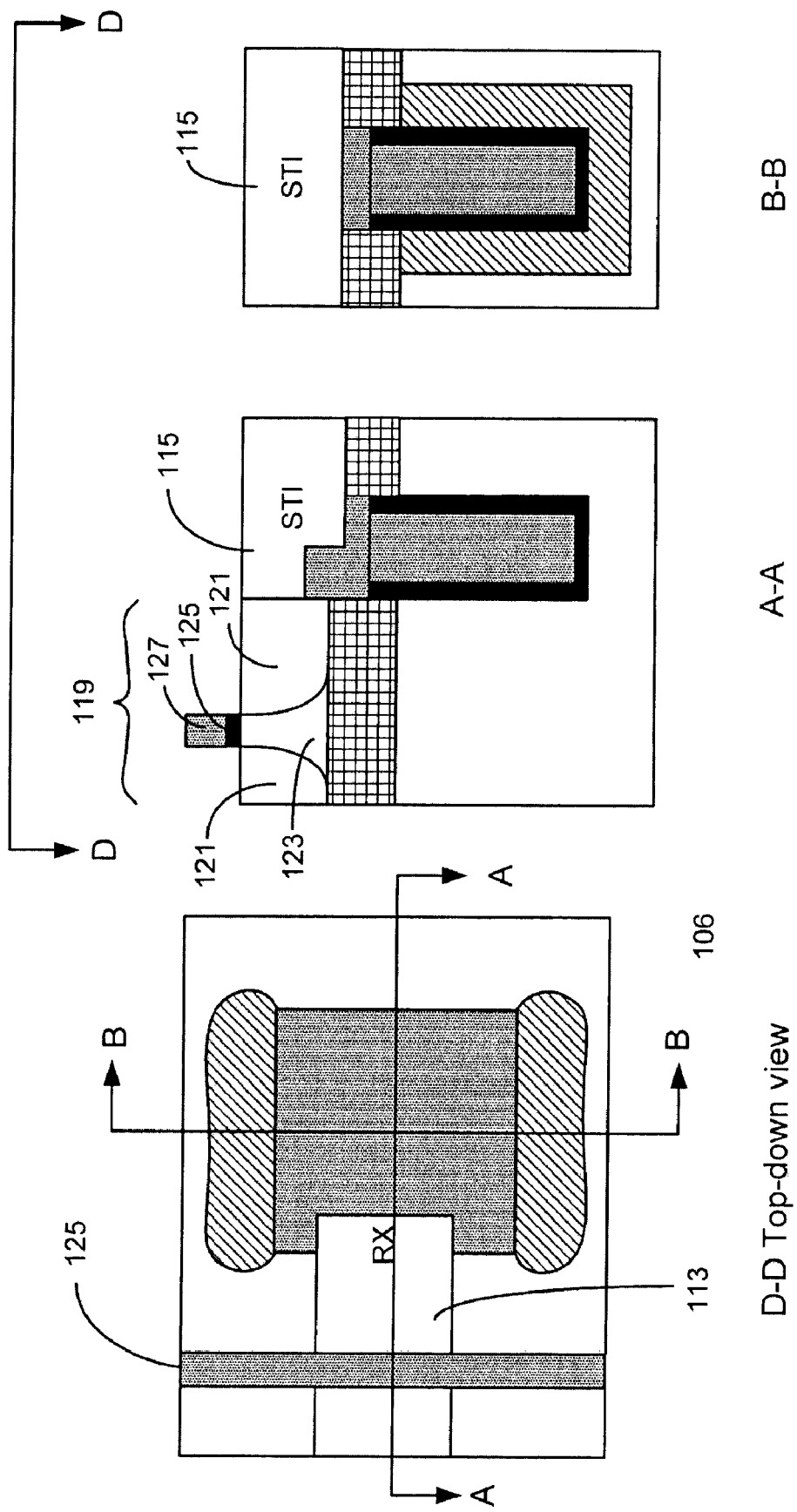
FIG. 8 further illustrates the method described in FIG. 1, including a top down view along a line D-D, a front partially cut-away view along the line A-A, and a side partially cut-away view along the line B-B.

FIG. 1 is a block diagram of an exemplary embodiment of a method for fabricating silicon-on-insulator (SOI) trench memory. The blocks in FIG. 1 will be discussed along with FIGS. 2-8 that illustrate the processing operations depicted in the blocks of FIG. 1. FIGS. 2-7 illustrate a top down view along a line C-C, a front partially cut-away view along a line A-A, and a side partially cut-away view along a line B-B. FIG. 8 illustrates a top down view along a line D-D, a front partially cut-away view along the line A-A, and a side partially cut-away view along the line B-B.

Figure 2:
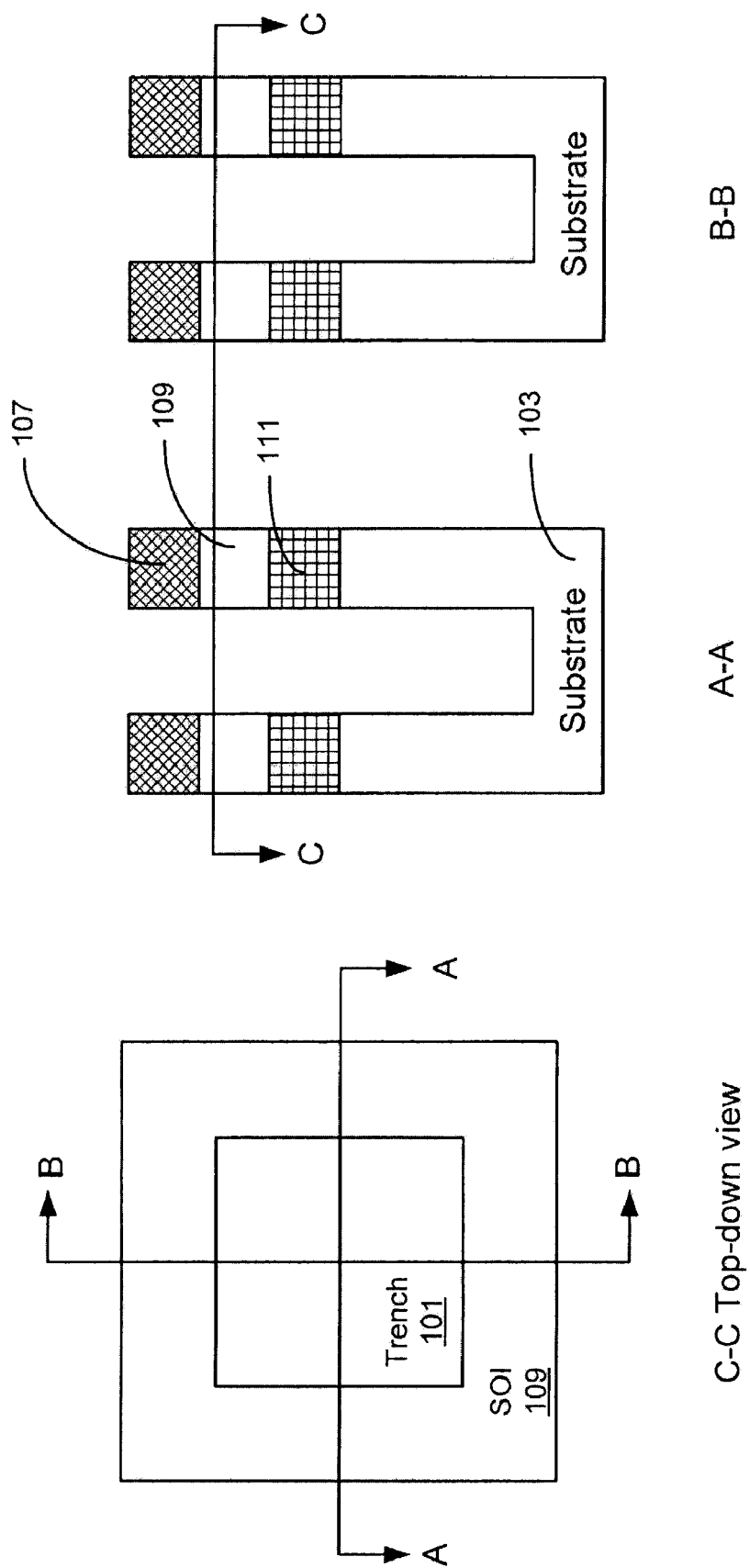
FIGS. 2-7 illustrate the method described in FIG. 1, including a top down view along a line C-C, a front partially cut-away view along a line A-A, and a side partially cut-away view along a line B-B.

FIG. 2 illustrates a silicon substrate 103 having a buried oxide (BOX) layer 111 disposed on the substrate 103. A silicon-on-insulator (SOI) layer 109 is disposed on the BOX layer 111. A hardmask layer 107, such as, for example, pad nitride or pad oxide is disposed on the SOI layer 109. In block 201 (of FIG. 1), a trench 101 is formed in the substrate 103 and through the layers disposed on the substrate 103. The C-C top down view on the left of FIG. 2 shows the SOI layer 109 and a trench 101.

Figure 3:
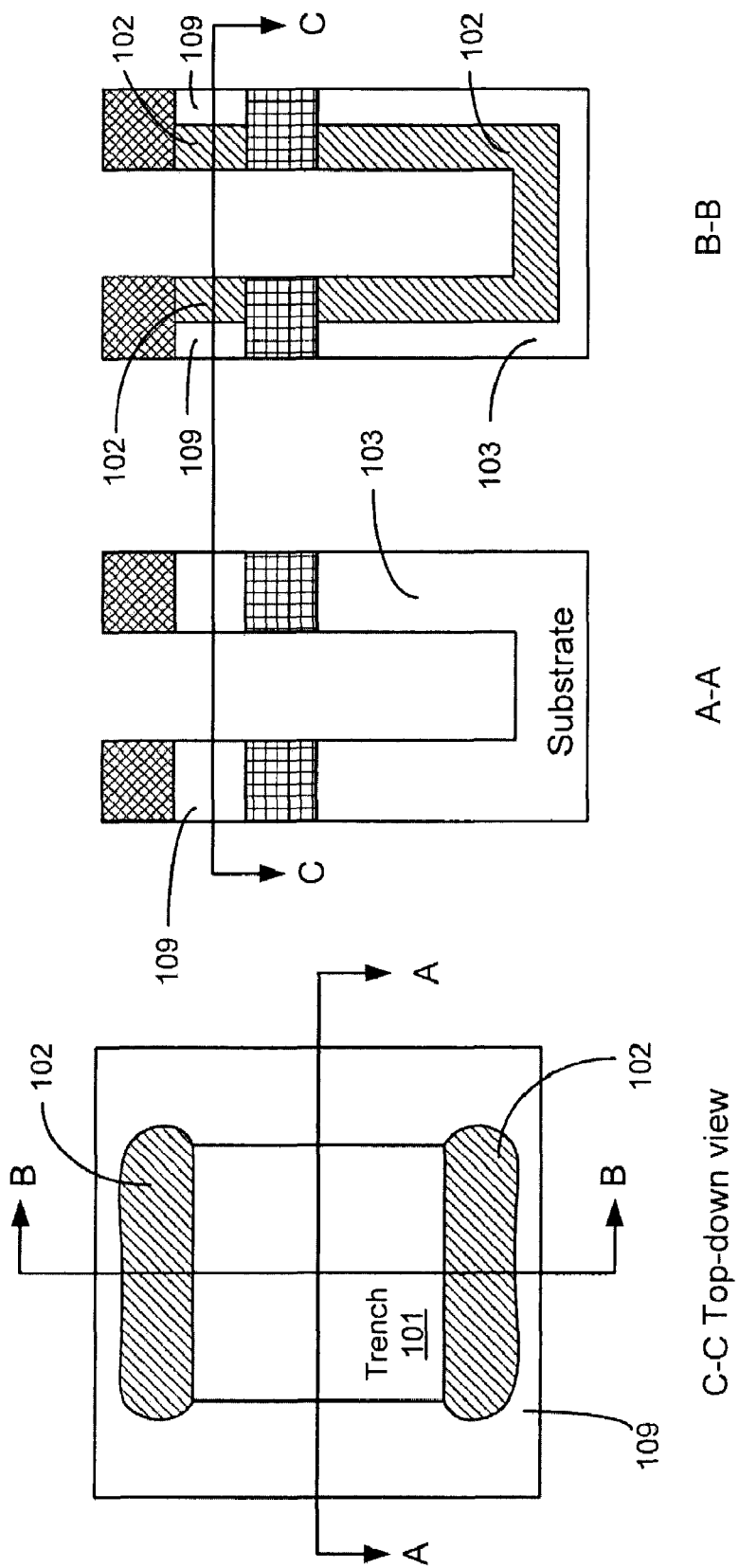

In block 203, ions are implanted into the trench in order to dope the substrate 103 and SOI layer 109. The ions are implanted into opposing sides of the trench 101 such that they form doped regions 102 as shown in FIG. 3. The doped regions 102 will form the plates of a capacitor. By doping the opposing sides of the trench 101 as opposed to doping all of the sides of the trench 101, undesirable doped regions are prevented from forming where a transistor or other structures (not shown) will later be formed.

Figure 4:
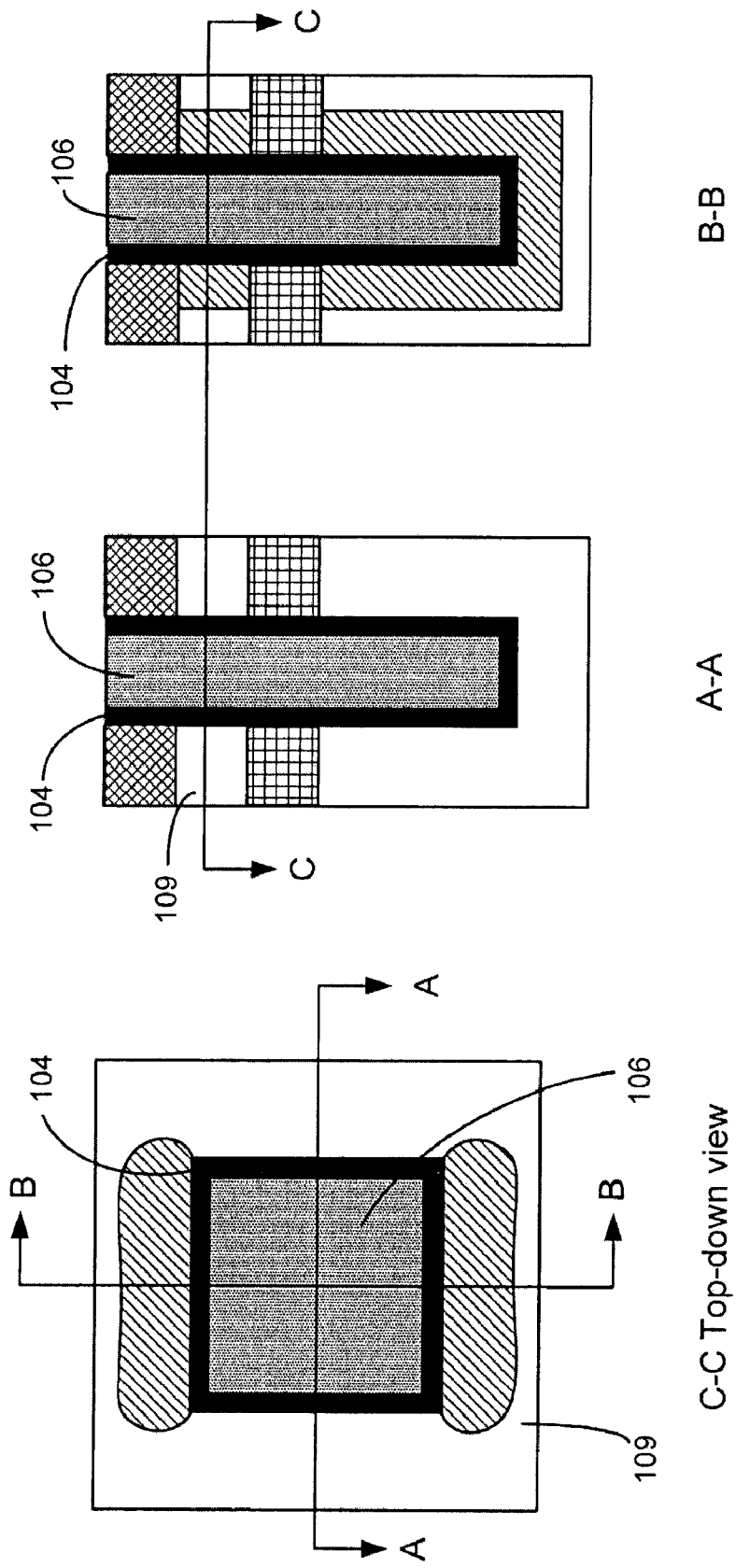

In block 205, a node dielectric layer 104 is formed in the trench 101. In block 207, the trench 101 is filled with a first polysilicon 106. The resultant structure is illustrated in FIG. 4.

Figure 5:
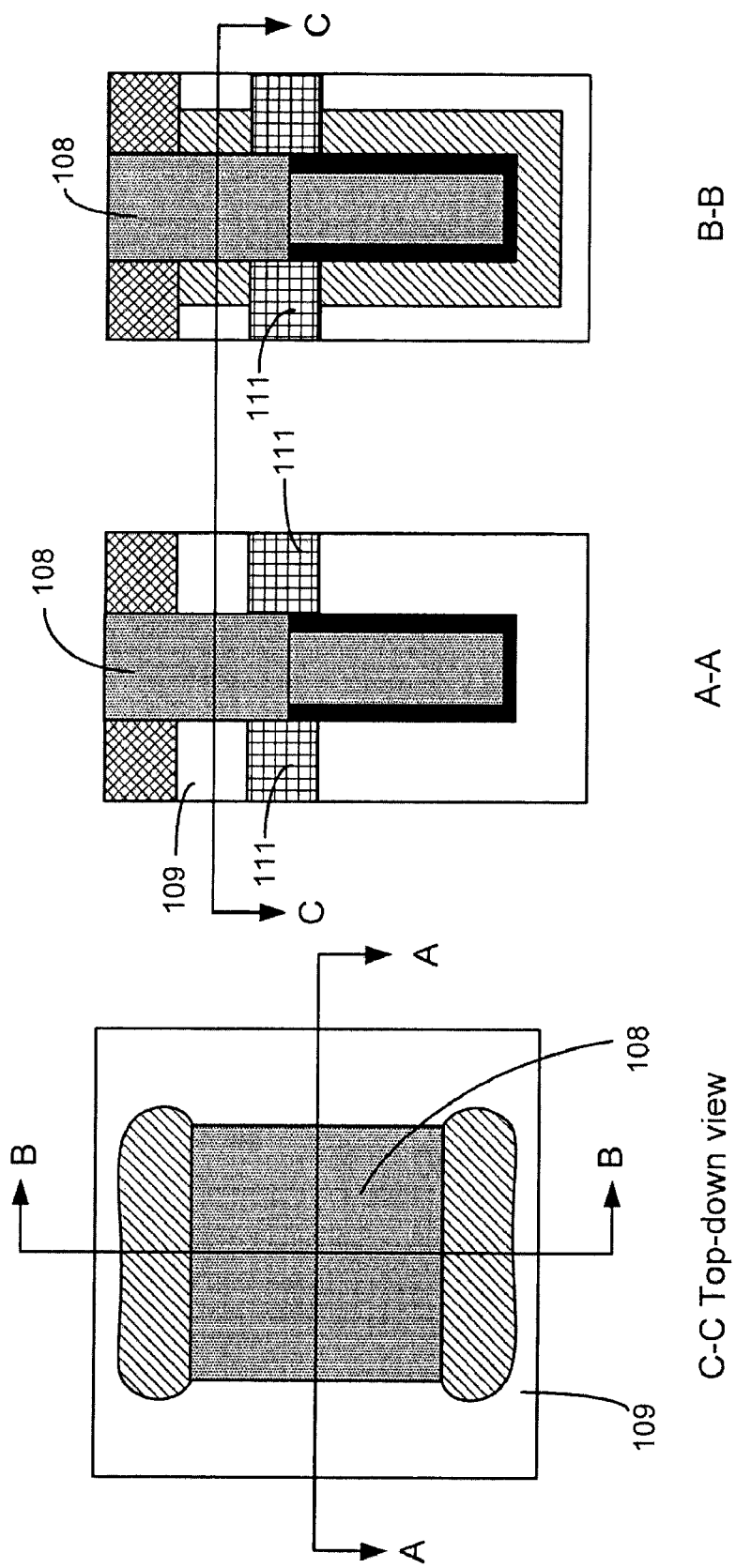

In block 209, a portion of the first polysilicon 106 is removed by a suitable process such as, for example, etching. A portion of the node dielectric layer 104 is also removed by a suitable process such as, for example, etching. The removal of the portion of the first polysilicon 106 and the portion of the node dielectric layer 104 exposes a portion of the BOX layer 111. The second polysilicon 108 is in electrical contact with the SOI layer 109. A second polysilicon 108 refills the trench 101 in block 211. The resultant structure is illustrated in FIG. 5.

A mask 107 such as a lithograph is developed on the hardmask layer 107 to define an active region (RX) 113 in block 213. Referring to FIG. 6, the mask 107 is illustrated in the front partially cut-away view along the line A-A, and the active region 113 is illustrated in the top down view along the line C-C.

A shallow trench isolation (STI) 115 is formed in block 215. The resultant structure is illustrated in FIG. 7. The STI 115 penetrates the hardmask layer 107, the SOI layer 109, and portions of the second polysilicon 108. The stepped shape of the STI 115 shown in the front partially cut-away view along the line A-A of FIG. 7 results from the presence of the mask 107 during the formation of the STI 115. The mask 107 slows the formation of the STI 115 in the areas defined by the mask 107.

Once the STI 115 is formed, the hardmask layer 107 is removed in block 117. A transistor 119 may be formed on the SOI layer 109 using a suitable lithographic and etching process. The resultant structure of an exemplary transistor 119 is illustrated in FIG. 8. In block 219, portions of the SOI layer 109 are doped. In the illustrated embodiment, regions 121 are n-type doped and region 123 is p-type doped. In block 221, a gate dielectric layer 125, such as, for example gate oxide, is disposed on the region 123. In block 223, a gate conductor 127 such as, for example, polysilicon is disposed on the gate dielectric layer 125. The illustrated embodiment of FIG. 8 shows one example of a type of transistor that may be formed; other structures may also be formed on the SOI layer 109.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating silicon-on-insulator (SOI) trench memory, the method comprising:

forming a trench in a substrate, wherein a buried oxide layer is disposed on the substrate, a SOI layer is disposed on the buried oxide layer, and a hardmask layer is disposed on the SOI layer; and implanting ions into the substrate and the SOI layer on a first opposing side of the trench and a second opposing side the trench to partially form a capacitor.

* * * * *